(12) United States Patent
Taylor et al.

(10) Patent No.: US 11,888,273 B1
(45) Date of Patent: Jan. 30, 2024

(54) POWER SUPPLY DOCKING STATION WITH INTERNAL BATTERY POWER

(71) Applicant: Perkins Technical Services, Inc., Huntsville, AL (US)

(72) Inventors: Jeffrey Keith Taylor, Huntsville, AL (US); Frank N. Perkins, III, Huntsville, AL (US); Jason Scott Mayfield, Huntsville, AL (US)

(73) Assignee: PERKINS TECHNICAL SERVICES, INC., Huntsville, AL (US)

( * ) Notice: Subject to any disclaimer, the term of this patent is extended or adjusted under 35 U.S.C. 154(b) by 283 days.

(21) Appl. No.: 17/346,878

(22) Filed: Jun. 14, 2021

Related U.S. Application Data

(60) Provisional application No. 63/038,495, filed on Jun. 12, 2020.

(51) Int. Cl.
*H01R 33/94* (2006.01)
*H01R 33/945* (2006.01)
*H02J 7/00* (2006.01)
*H05K 5/03* (2006.01)

(52) U.S. Cl.
CPC .......... *H01R 33/94* (2013.01); *H01R 33/945* (2013.01); *H02J 7/0042* (2013.01); *H05K 5/03* (2013.01); *H01R 2201/24* (2013.01)

(58) Field of Classification Search
CPC .. H01R 33/94; H01R 33/945; H01R 2201/24; H02J 7/0042; H05K 5/03
See application file for complete search history.

(56) References Cited

U.S. PATENT DOCUMENTS

| | | | |
|---|---|---|---|
| 4,652,769 A | 3/1987 | Smith et al. |
| 4,882,655 A | 11/1989 | Pavie |
| 5,568,370 A | 10/1996 | Goldstein et al. |
| 5,604,663 A | 2/1997 | Shin et al. |
| 5,611,701 A | 3/1997 | Hahn |
| 5,627,450 A | 5/1997 | Ryan et al. |
| 5,636,112 A | 6/1997 | Faulk |
| 5,687,061 A | 11/1997 | Mesfin et al. |
| 5,913,926 A | 6/1999 | Anderson et al. |
| 5,924,877 A | 7/1999 | Byrne et al. |
| 5,966,285 A | 10/1999 | Sellers |
| 6,040,681 A | 3/2000 | May |
| 6,163,086 A | 12/2000 | Choo |
| 6,191,553 B1 | 2/2001 | Feng-Jung |
| 6,231,371 B1 | 5/2001 | Helot |
| 6,272,016 B1 | 8/2001 | Matonis et al. |
| 6,309,230 B2 | 10/2001 | Helot |

(Continued)

*Primary Examiner* — Michael C Zarroli
(74) *Attorney, Agent, or Firm* — Angela Holt; Frank M. Caprio; Bradley Arant Boult Cummings LLP

(57) ABSTRACT

A power supply docking station for a SINCGARS RT-1523 radio has a housing configured to support and provides DC power to the radio and a power amplifier. The housing has an integrated battery compartment for receiving at least two military standard BB-2590 batteries. Each battery can independently power the radio and the power amplifier, such that the other battery can be swapped out while the radio and power amplifier are in use. In another embodiment, a power supply docking station supports and provides power to a Harris 150-series radio. In another embodiment, a power supply docking station supports and provides power to a Harris 160-series radio.

9 Claims, 3 Drawing Sheets

(56) References Cited

U.S. PATENT DOCUMENTS

| | | | |
|---|---|---|---|
| 6,341,218 B1 | 1/2002 | Poplawsky et al. | |
| 6,453,378 B1 | 9/2002 | Olson et al. | |
| 6,480,723 B1 | 11/2002 | Davidson et al. | |
| 6,491,278 B1 | 12/2002 | Thomson | |
| 6,604,199 B1 | 8/2003 | Yang et al. | |
| 6,625,015 B2 | 9/2003 | Yin | |
| 6,731,507 B2 | 5/2004 | Varghese et al. | |
| 6,747,866 B1 * | 6/2004 | Lebo | H05K 7/20545 361/801 |
| 6,784,570 B1 | 8/2004 | Walls et al. | |
| 6,975,511 B1 | 12/2005 | Lebo et al. | |
| 7,099,152 B2 | 8/2006 | Gasbarro et al. | |
| 7,397,907 B2 | 7/2008 | Petite | |
| 7,719,132 B2 | 5/2010 | Hatten et al. | |
| 8,059,412 B2 | 11/2011 | Perkins et al. | |
| 8,149,592 B2 | 4/2012 | Perkins et al. | |
| 8,693,183 B1 * | 4/2014 | Alameda | G06F 1/1632 361/679.56 |
| 2010/0067619 A1 | 3/2010 | Furman et al. | |
| 2010/0067634 A1 | 3/2010 | Furman et al. | |

* cited by examiner

POWER SUPPLY DOCKING STATION WITH INTERNAL BATTERY POWER

REFERENCE TO RELATED APPLICATIONS

The present application claims priority to U.S. Provisional Application No. 63/038,495, titled "Power Supply Docking Station with Internal Battery Power," filed Jun. 12, 2020, which is fully incorporated herein by reference.

BACKGROUND AND SUMMARY

As expeditionary missions for military operations become the norm, it is important to continually examine how military forces are equipped to deploy tactical radios. The primary tactical radios used by Brigade Combat Team (BCT) ground forces include: SINCGARS ASIP (VHF), PRC-117G, PRC-160, PRC-158 and other military radios for Special Operations. BCTs need to be trained and proficient in deployment and operation of their currently-fielded tactical radios. Regardless of military occupational specialty, Soldiers must be able to quickly deploy their radios for conduct of operations. This is especially important in expeditionary environments characterized by remote dispersion of forces and fast-moving operations.

The current method of installing tactical radios for fixed Command Post Operations, operations in vehicles, and operations conducted by dismounted foot soldiers are different and provide different levels of capability. Having three different methods of deploying the same tactical radio is inefficient. In some cases, soldiers use the same tactical radio installation kits and mounts designed for vehicles (weighing over 100 pounds) in the mid-1990s to set up communications on a table inside a CP but then require an external Power Supply (weighing in at over 40 pounds) to power this system. As a result of PTS's earlier development of a tactical radio Power Supply Docking Station (PSDS), many users have purchased the PTS PSDS (weighing approximately 20 pounds and includes the aforementioned power supply) to conduct expeditionary missions. The PTS PSDS offers significantly reduced weight, bulk, and complexity while improving reliability.

Based on PTS's experience developing the current suite of Power Supply Docking Stations, PTS saw a path to standardize radio operations in fixed command posts, in vehicles, and for dismounted Soldiers. The standardization of radio operations involves expanding the capabilities of the PSDS to provide all soldiers an enhanced power feature of embedding military batteries into the chassis of the PSDS, enabling the new PSDS to be installed in a vehicle. The PSDS installed in the vehicle can then be removed from a vehicle and used in a fixed Command Posts, or by dismounted soldiers conducting remote expeditionary operations. The internal battery bank of the PSDS holds two military standard BB-2590 batteries. These batteries can be swapped out without interrupting radio operations. We refer to this as hot swapping of the batteries. There is no need to turn the radio off when moving from one power source to another. This invention is revolutionary because it can be used by soldiers in all three scenarios without modification. The addition of internal batteries in the PSDS also supports the use of radio power amplifiers which expands the range of communications. This added capability is embedded in a small lightweight, water resistant, reliable package. Currently dismounted soldiers have no way to enjoy the advantages of using the power amplifier for their radios in a single system that could always be available to the user. Initial deployment and installation of a communication system can be accomplished without the necessity of an external power system. The soldier will have a self-contained unit providing radio, long range amplifier, and power source, all carried in one hand to the communication site. This site can run for hours or days with only the swapping of a few batteries, while never losing communication. This has advantages in rapid deploy as well as silent running operations.

In the vehicle the upgraded PSDS can be plugged into the 28 VDC vehicle power; in the CP the PSDS can be mounted into a CP rack which would take either 28 VDC power from an external 28 VDC source, or the PSDS CP rack that would provide the 28 VDC power. For the dismounted foot solider the PSDS would operate on the internal battery bank. With the system according to the present disclosure the user now has the ability to mount two different military radios in a small space inside of the vehicle in a space that currently only will accommodate one or two radios of the same type. This offers vehicle-mounted troops a significant advantage over the current system. In the CP the soldiers would be able to select different radios with significantly reduced footprint again a significant advantage. These operational advantages are an evolutionary improvement to current military communications operations.

Unique capabilities of this new system include the following: Small footprint, lightweight, radio can always be powered on, power amplifier power always available, water resistant, modular, external power available via the standard NATO power connector, common vehicle mounting system across all military radios, hot swappable batteries without interrupting radio operations, and very easy to use with minimal impact on training.

DETAILED DESCRIPTION

Figure 1:
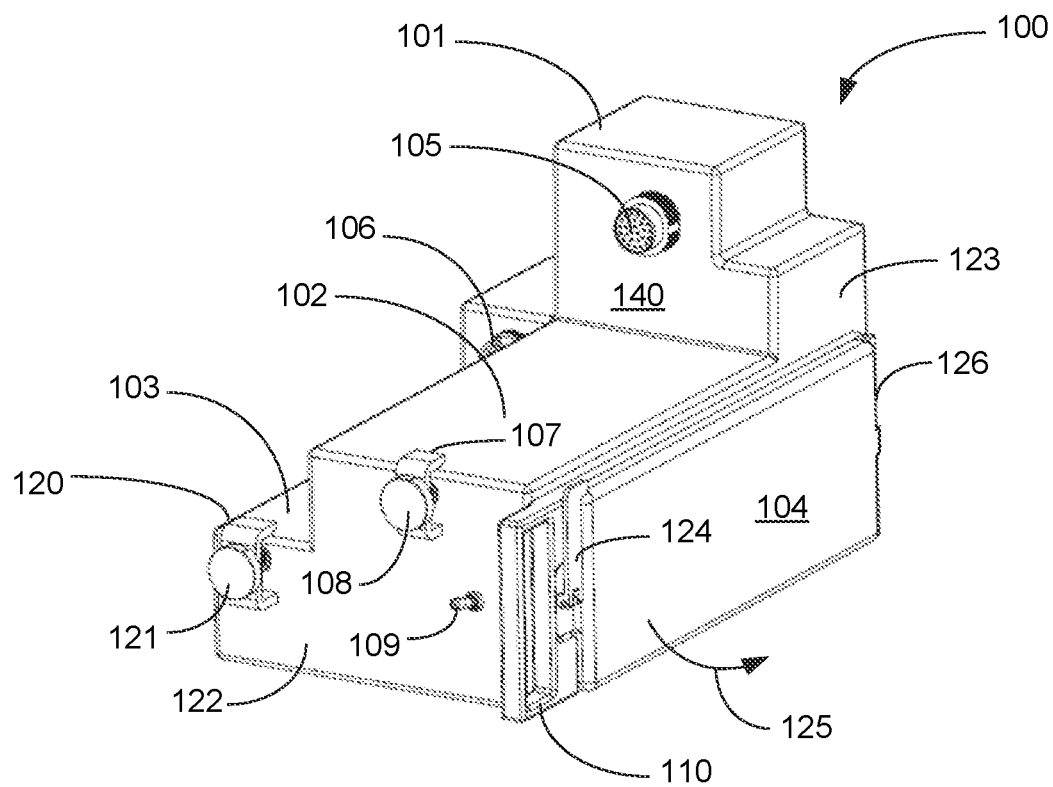
FIG. 1 is a front perspective view of a PSDS configured to support a SINCGARS RT-1523 radio according to an exemplary embodiment of the present disclosure.

FIG. 1 is a front perspective view of an embodiment of a power supply docking station (PSDS) 100 configured to support a SINCGARS RT-1523 radio (not shown). The PSDS comprises a housing 101 that comprises an upper support platform 102 and a lower support platform 103. The upper support platform 102 is configured to receive the radio. A radio connector 105 connects to the radio when it is installed on the upper support platform 102 to provide power to the radio. A back support portion 140 of the housing 101 provides a back stop against which the radio rests when it is installed on the PSDS. The connector 105 is disposed on the back support portion 140 of the housing 101. A clamp 107 affixed to the housing 101 via a thumb screw 108 is operable to affix the radio to the upper support platform 102.

The lower support platform 103 is configured to receive a radio frequency power amplifier (RFPA) (not shown). An RFPA connector 106 connects to the RFPA when it is installed on the lower support platform 103 to provide power to the RFPA. A clamp 120 affixed to the housing 101 via a thumb screw 121 is operable to affix the RFPA to the upper support platform 103. A power switch 109 is disposed on a front side 122 of the housing 101. Actuating the power switch 109 powers the PSDS 100.

A battery compartment cover 104 on a right side 123 of the housing 101 covers a battery compartment (not shown) that is disposed within the housing 101. The battery compartment cover 104 comprises a handle 110 on its frontward end that extends beyond the front side 122 of the housing 101. A latch 124 on the battery compartment cover 104 actuates to secure the battery compartment cover 104 closed, and to allow the battery compartment cover 104 to be opened. The battery compartment cover 104 swings open in the direction indicated by directional arrow 125 to expose the batteries (not shown) within the battery compartment. In this regard, hinges (not shown) are disposed on a rearward end 126 of the battery compartment cover 104.

Figure 2:
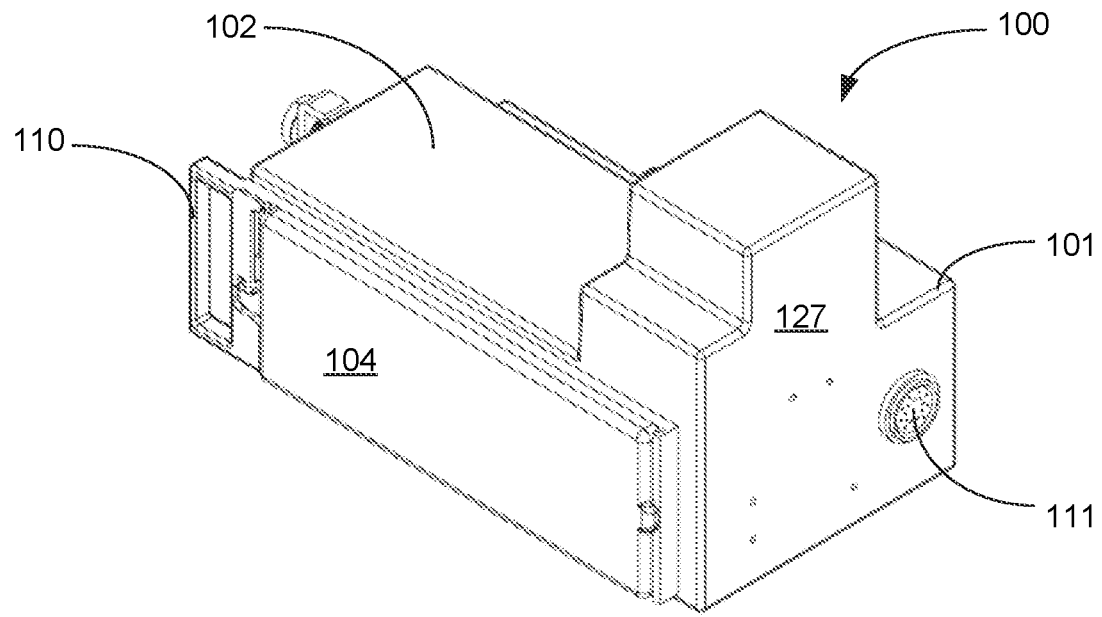
FIG. 2 is a rear perspective view of the PSDS of FIG. 1.

FIG. 2 is a rear perspective view of the PSDS 100 of FIG. 1. An auxiliary power connector 111 is disposed on a rear side 127 of the housing 101. The auxiliary power connector can be used to connect the PSDS to an external DC power source, such as a car battery.

Figure 3:
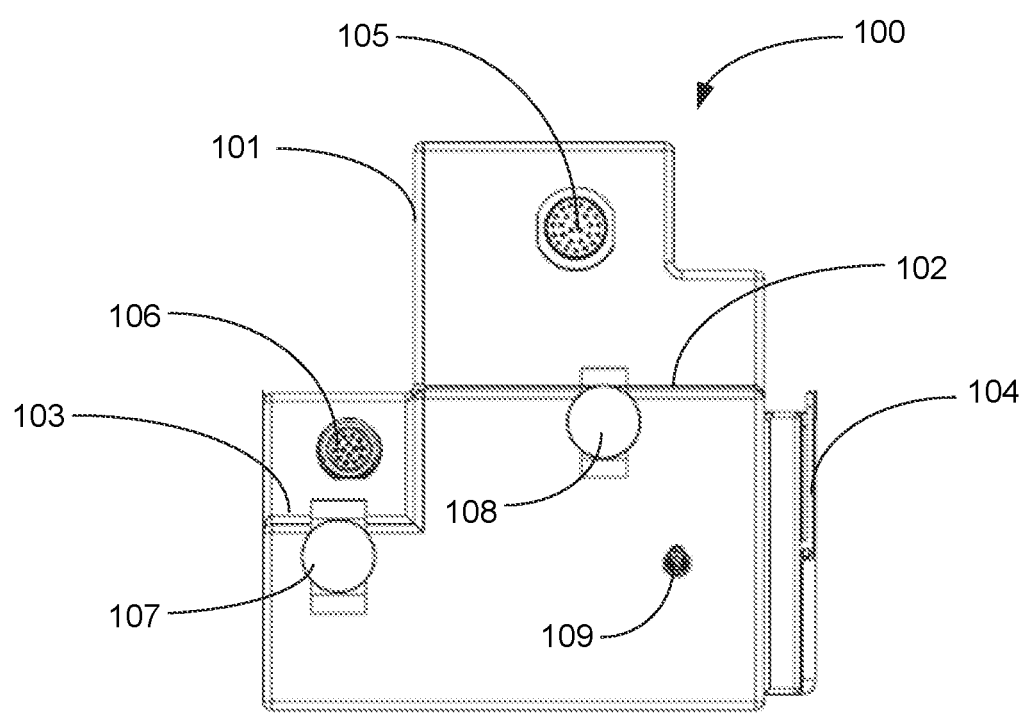
FIG. 3 is a front plan view of the PSDS of FIG. 1.

FIG. 3 is a front plan view of the PSDS 100 of FIG. 1. The upper support platform 102 is higher than the lower support platform 103 as shown. The upper support platform 102 and the lower support platform 103 are both substantially flat and substantially horizontal. The back support portion 140 of the housing 101 extends vertically from the lower support platform 102, perpendicularly from the lower support platform 102.

A bottom side 130 of the housing 101 is substantially flat and substantially horizontal in the illustrated embodiment, ideally for sitting on a flat surface.

Figure 4:
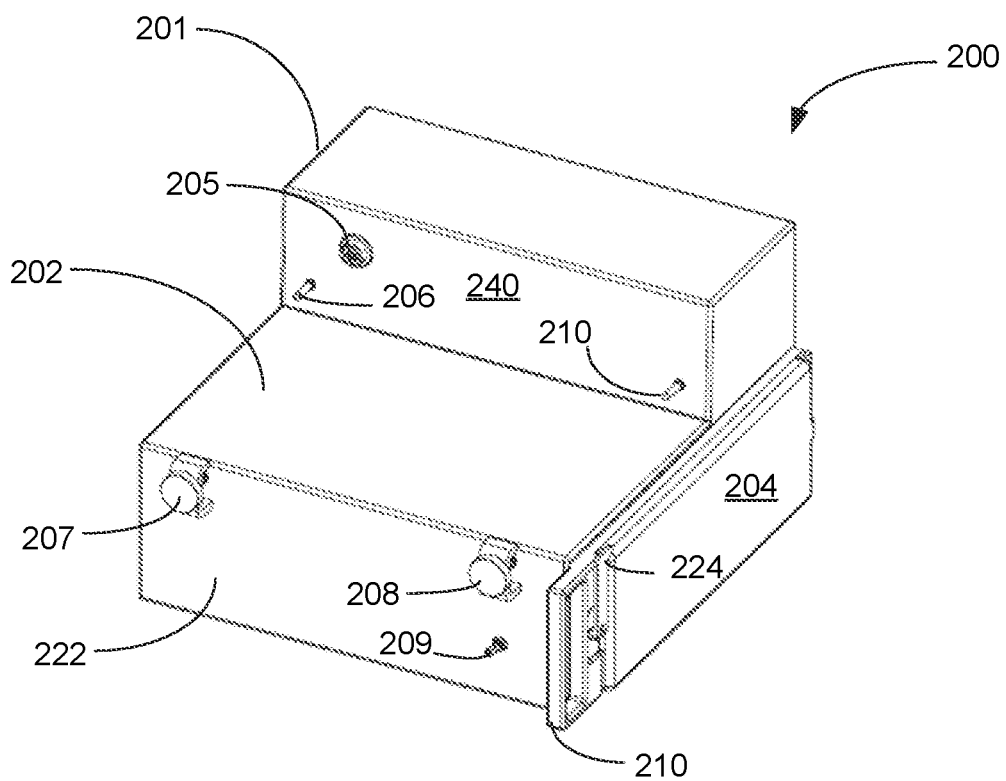
FIG. 4 is a front perspective view of a PSDS configured to support a AN/PRC-150(C) radio according to an exemplary embodiment of the present disclosure.

FIG. 4 is a front perspective view of a PSDS 200 according to another embodiment of the present disclosure. In this embodiment, the PSDS 200 is configured to receive, support and provide power to a Harris AN/PRC-150(C) radio (not shown). The PSDS 200 comprises a housing 201 that comprises a support platform 202. The support platform 202 is configured to receive the radio. A radio connector 205 connects to the radio when it is installed on the support platform 202 to provide power to the radio. Clamps 207 and 208 affixed to the housing 101 via thumb screws 220 and 221 are operable to affix the radio to the support platform 202.

Guide pins 206 and 210 serve to align the radio with the support platform 202 for connection of the radio to the PSDS 200. In this regard, the radio (not shown) comprises openings for receiving the guide pins when the radio and PSDS are in proper alignment. A back support portion 240 of the housing 201 provides a back stop against which the radio rests when it is installed on the PSDS. The connector 205 is disposed on the back support portion 240 of the housing 201. A power switch 209 is disposed on a front side 222 of the housing 101. Actuating the power switch 209 powers the PSDS 200.

A battery compartment cover 204 on a right side 223 of the housing 201 covers a battery compartment (not shown) that is disposed within the housing 201. The battery compartment cover 204 comprises a handle 210 on its frontward end that extends beyond the front side 222 of the housing 201. A latch 224 on the battery compartment cover 204 actuates to secure the battery compartment cover 204 closed, and to allow the battery compartment cover 204 to be opened. The battery compartment cover 204 swings open in the same manner discussed above with respect to the PSDS 100 of FIG. 1.

Figure 5:
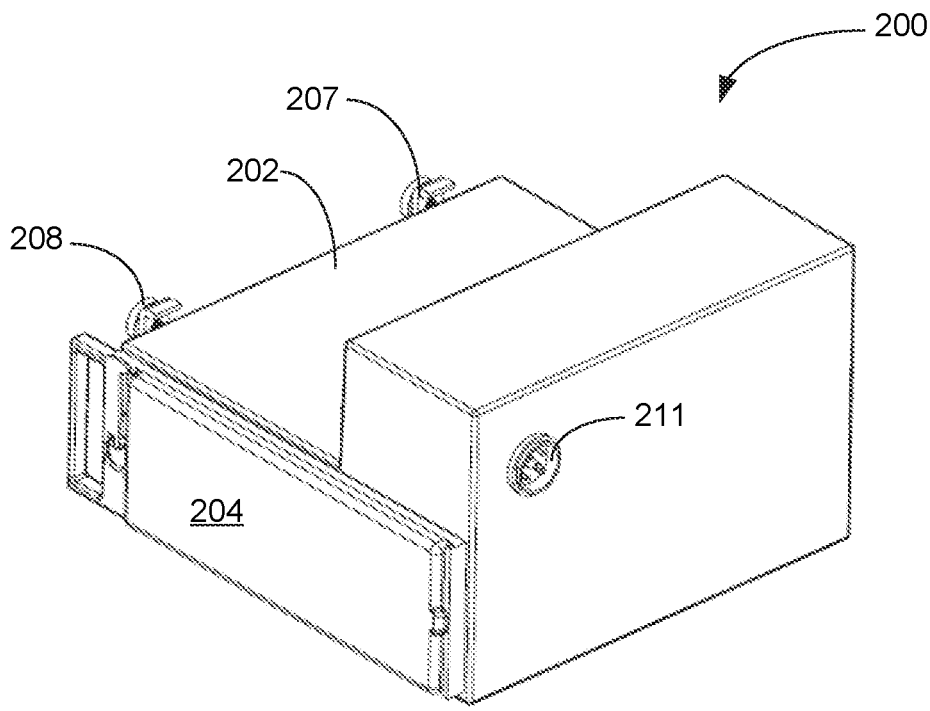
FIG. 5 is a rear perspective view of the PSDS of FIG. 4.

FIG. 5 is a rear perspective view of the PSDS 200 of FIG. 4. An auxiliary power connector 211 is disposed on a rear side 127 of the housing 101. The auxiliary power connector can be used to connect the PSDS to an external DC power source, such as a car battery.

In another embodiment of the present disclosure, the PSDS (not shown) supports a Harris AN/PRC-160(V) radio. This unpictured embodiment is substantially similar to that shown in FIGS. 5 and 6, only with different dimensions.

What is claimed is:

1. A power supply docking station for a SINCGARS RT-1523 radio comprising:
   a housing configured to support and provide power to the radio and a power amplifier;
   a first connector affixed to the housing, the first connector configured for electrically connecting with the radio;
   a second connector affixed to the housing, the second connector configured for electrically connecting with the power amplifier;
   a battery compartment within the housing, the battery compartment configured to receive and retain at least two military standard BB-2590 batteries, each battery electrically connected to the connector, each battery configured to, independently of the other battery, power the radio and the power amplifier.

2. The power supply docking station of claim 1, the housing further comprising an auxiliary power connector configured to connect to an external DC power course.

3. The power supply docking station of claim 2, the auxiliary power connector disposed on a rear side of the housing.

4. The power supply docking station of claim 1, further comprising an upper support platform configured to receive and support the radio.

5. The power supply docking station of claim 4, further comprising a lower support platform configured to receive and support the power amplifier.

6. The power supply docking station of claim 5, wherein the upper support platform is higher than the lower support platform.

7. The power supply docking station of claim 5, wherein the upper support platform and the lower support platform are each substantially flat and substantially horizontally-disposed.

8. The power supply docking station of claim 1, the housing further comprising a battery compartment cover configured to swing open to allow access to the batteries.

9. The power supply docking station of claim 1, the housing further comprising a battery compartment cover configured to swing open to allow access to the batteries.

* * * * *